US006424187B1

(12) United States Patent
Takahashi et al.

(10) Patent No.: US 6,424,187 B1
(45) Date of Patent: *Jul. 23, 2002

(54) DRIVING APPARATUS FOR POWER MOS TRANSISTOR

(75) Inventors: Naoyuki Takahashi, Mito; Sakae Hikita; Keiichi Mashino, both of Hitachinaka, all of (JP)

(73) Assignees: Hitachi, Ltd., Tokyo; Hitachi Car Engineering Co., Ltd., Hitachinaka, both of (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/989,237

(22) Filed: Dec. 12, 1997

(30) Foreign Application Priority Data

Dec. 18, 1996 (JP) .............................. 8-337982

(51) Int. Cl.⁷ ............................................ H03B 1/00
(52) U.S. Cl. ...................... 327/110; 327/108; 327/398
(58) Field of Search ................ 327/427, 108, 327/110, 379, 383, 392–394, 398, 399, 395, 400; 322/18, 25, 27

(56) References Cited

U.S. PATENT DOCUMENTS

| 4,414,479 A | * | 11/1983 | Foley .......................... 361/427 |
| 4,498,019 A | * | 2/1985 | Berger ..................... 327/132 E |
| 5,057,765 A | * | 10/1991 | Clark et al. ................. 323/288 |
| 5,075,568 A | * | 12/1991 | Bilotti et al. ................ 327/110 |
| 5,138,515 A | * | 8/1992 | Bourgeois ..................... 361/18 |
| 5,144,220 A | * | 9/1992 | Iwatani et al. ................. 322/28 |
| 5,274,322 A | * | 12/1993 | Hayashi et al. ................ 322/90 |
| 5,416,361 A | * | 5/1995 | John et al. ................... 327/310 |
| 5,424,666 A | * | 6/1995 | Palara et al. ................. 327/110 |
| 5,561,363 A | * | 10/1996 | Mashino et al. ............... 322/25 |
| 5,663,667 A | * | 9/1997 | Blum et al. .................. 327/134 |
| 5,757,214 A | * | 5/1998 | Stoddard ..................... 327/110 |
| 5,808,504 A | * | 9/1998 | Chikai et al. ................ 327/434 |
| 5,880,577 A | * | 3/1999 | Aoyama et al. ............... 322/29 |
| 6,121,757 A | * | 9/2000 | Takahashi et al. ............. 322/28 |

FOREIGN PATENT DOCUMENTS

| DE | 40 13 997 A1 | 11/1991 |
| DE | 40 34 845 A1 | 5/1992 |
| EP | WO 88/08228 | 10/1988 |
| JP | 64-20000 | 1/1989 |

* cited by examiner

Primary Examiner—Timothy R. Callahan
Assistant Examiner—Hai L. Nguyen
(74) Attorney, Agent, or Firm—Crowell & Moring LLP (57) ABSTRACT

When a MOS transistor is turned off, a forward current flows into a diode connected to the MOS transistor. When the MOS transistor is conducted, a reverse bias is applied to the diode. When the MOS transistor is turned on during the reverse recovery time of the diode, a short-circuit current flows into the MOS transistor, the diode, and a battery connected in series with the diode and the MOS transistor. In this case, an overcurrent flows through the wiring of the battery momentarily, and electromagnetic wave generates from the wiring. Accordingly, noise caused by the electromagnetic wave is generated in an antenna to a radio receiver. The drain current of the MOS transistor is gradually increased by a delay circuit, and the MOS transistor is shifted from a completely turned-off state to a completely turned-on state with a time period longer than a reverse recovery time of the diode. Consequently, no reverse current flows through the diode. Therefore, a short-circuit current is prevented from flowing through the battery, the diode, and the transistor, and no noise is generated in the receiver.

8 Claims, 5 Drawing Sheets

FIG.3B
COLLECTOR
VOLTAGE OF
TRANSISTOR
209

DRIVING APPARATUS FOR POWER MOS TRANSISTOR

BACKGROUND OF THE INVENTION

The present invention relates to a driving apparatus for a MOS (metal oxide-semiconductor) transistor and, more particularly, to a driving apparatus for a MOS power transistor which controls an amount of a large current supplied to a winding with a large inductance.

For example, current is supplied to a field winding of a generator for an automobile, and an amount of the current is controlled by a MOS power transistor. At the time of controlling an amount of current supplied to a field winding of a generator for an automobile, there arises a problem that radio noise is generated.

As an example of an apparatus having means for suppressing the generation of such radio noise, there is a voltage regulator disclosed in JP-A-64-20000. In the voltage regulator disclosed in JP-A-64-20000, in order to decrease the radio noise, a current flowing into a field winding is controlled in a manner that a value of a current flowing into the field winding at the time of switching is subjected to feedback control so that an amount of change in the field current is not more than a constant value.

SUMMARY OF THE INVENTION

However, since the voltage regulator disclosed in JP-A-64-20000 performs the feedback control as to a value of a current flowing into the field winding, the voltage regulator requires expensive parts such as a current detection circuit for detecting a field current, an operational amplifier etc. Accordingly, the voltage regulator has a problem that the arrangement thereof is complicated and a cost thereof is expensive.

Accordingly, an object of the present invention is to provide a driving apparatus for a MOS transistor which is able to suppress the generation of radio noise etc. with a simple configuration and cheep cost.

In order to attain the aforesaid object, according to an aspect of the present invention, there is provided with a driving apparatus for a MOS transistor which includes a diode connected in parallel to a winding which is connected in series with a battery; a MOS transistor connected between the winding and the battery; a driving circuit which generates signals for turning on and off the MOS transistor to drive a gate of the MOS transistor; and a delay circuit which is disposed between the driving circuit and the MOS transistor and delays the signal generated from the driving circuit for changing the MOS transistor from a turned-off state to a turned-on state so that the MOS transistor is shifted from a completely turned-off state to a completely turned-on state with a predetermined time period longer than a reverse recovery time of the diode.

The delay circuit serves to shift the MOS transistor from the completely turned-off state to the completely turned-on state with the time period longer than the reverse recovery time of the diode. Accordingly, there flows little reverse current through the diode and so such a phenomenon is prevented from occurring that the short-circuit current flows through the battery, the diode and the MOS transistor.

In this case, the delay circuit can be formed by a simple circuit including transistors, a capacitor etc.

According to another aspect of the present invention, there is provided with a driving apparatus for a MOS transistor which includes a diode connected in parallel to a winding which is connected in series with a battery; a MOS transistor connected between the winding and the battery; a driving circuit which generates signals for turning on and off the MOS transistor to drive a gate of the MOS transistor; and a function generation circuit which is disposed between the driving circuit and the MOS transistor and converts the signal generated from the driving circuit for changing the MOS transistor from a turned-off state to a turned-on state into a voltage-which is to be applied to the gate of the MOS transistor as a voltage of time function gradually increasing with time lapse so that the MOS transistor is shifted from a completely turned-off state to a completely turned-on state with a predetermined time period longer than a reverse recovery time of the diode.

The function generation circuit applies the voltage of time function gradually increasing with time lapse to the MOS transistor thereby to shift the MOS transistor from the completely turned-off state to the completely turned-on state with the time period longer than the reverse recovery time of the diode. Accordingly, there flows little reverse current through the diode and so such a phenomenon is prevented from occurring that the short-circuit current flows through the battery, the diode and the MOS transistor.

In this case, the function generation circuit can be formed by a simple circuit including transistors, a capacitor etc.

According to still another aspect of the present invention, there is provided with a driving apparatus for a MOS transistor which includes an armature winding of a generator for charging a battery; a diode connected in series with the battery and connected in parallel to a filed winding for supplying magnetic flux to the armature winding; a MOS transistor connected between the field winding and the battery; a driving circuit which generates signals for turning on and off the MOS transistor to drive a gate of the MOS transistor; and a delay circuit which is disposed between the driving circuit and the MOS transistor and delays the signal generated from the driving circuit for changing the MOS transistor from a turned-off state to a turned-on state so that the MOS transistor is shifted from a completely turned-off state to a completely turned-on state with a predetermined time period longer than a reverse recovery time of the diode.

According to still another aspect of the present invention, there is provided with driving apparatus for a MOS transistor which includes an armature winding of a generator for charging a battery; a diode connected in series with the battery and connected in parallel to a filed winding for supplying magnetic flux to the armature winding; a MOS transistor connected between the field winding and the battery; a driving circuit which generates signals for turning on and off the MOS transistor to drive a gate of the MOS transistor; and a function generation circuit which is disposed between the driving circuit and the MOS transistor and converts the signal generated from the driving circuit for changing the MOS transistor from a turned-off state to a turned-on state into a voltage which is to be applied to the gate of the MOS transistor as a voltage of time function gradually increasing with time lapse so that the MOS transistor is shifted from a completely turned-off state to a completely turned-on state with a predetermined time period longer than a reverse recovery time of the diode.

Preferably, the function generation circuit includes a capacitor, a charge/discharge circuit for charging and discharging the capacitor in synchronism with the signals for turning on and off the MOS transistor, and an amplifier for outputting a voltage corresponding to a voltage of the capacitor.

DESCRIPTION OF THE PREFERRED EMBODIMENT

A driving apparatus for a MOS transistor according to an embodiment of the present invention will be described with reference to the accompanying drawings.

Figure 1:
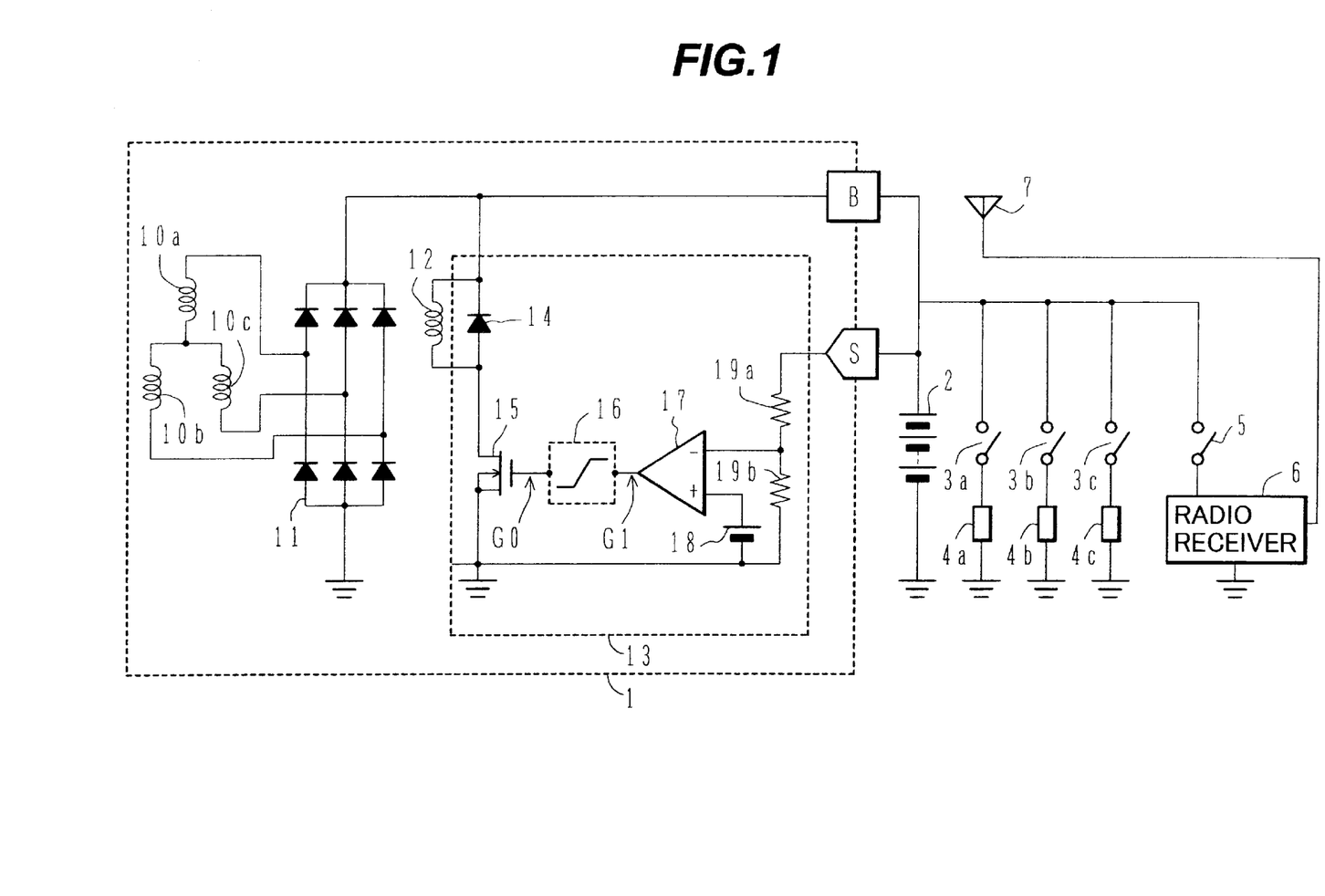
FIG. 1 is a schematic circuit diagram showing a driving apparatus for a MOS transistor according to an embodiment of the present invention.

FIG. 1 is a schematic circuit diagram showing the driving apparatus for a MOS transistor according to the embodiment of the present invention, in which case, the present invention is applied to a voltage regulator for a generator of an automobile.

In FIG. 1, a generator 1 for an automobile includes three-phase armature windings 10a, 10b, 10c, and a rectifier 11 for converting AC (alternating current) output from the three-phase armature windings 10a, 10b, 10c into a DC (direct current) output. Further, the generator 1 includes a field winding 12 which is supplied with rotation force from an internal combustion engine (not shown) and supplies the three-phase armature windings 10a, 10b, 10c with magnetic fluxes, and a voltage regulator 13 for controlling a field current flowing into the field winding 12.

The voltage regulator 13 includes a diode 14 connected in parallel to the field winding 12 and having a cathode connected to the rectifier 11 and to an output terminal B, a MOS power transistor 15 connected in series with the parallel circuit of the field winding 12 and the diode 14, a delay circuit 16 for delaying a drive signal for driving the gate of the MOS power transistor 15, and a comparator 17 for supplying an output signal thereof to the input terminal of the delay circuit 16. The anode of the diode 14 is connected to the drain of the MOS power transistor 15 whose source is grounded.

The voltage regulator 13 further includes a reference voltage source 18 having an anode connected to the positive input terminal of the comparator 17 and a cathode being grounded, a resistor 19a for a voltage divider having one terminal connected to the negative input terminal of the comparator 17 and the other terminal connected to a voltage detection terminal S, and a resistor 19b for the voltage divider having one terminal connected to the negative input terminal of the comparator 17 and the other terminal connected to the cathode of the reference voltage source 18.

The aforesaid comparator 17, the reference voltage source 18, the resistor 19a and the resistor 19b form a driving circuit for driving the gate of the MOS power transistor 15.

The output terminal B of the generator 1 is connected to the anode side of a battery 2 and further connected to electric units 4a, 4b, 4c to be mounted in an automobile through switches 3a, 3b, 3c, respectively. The electric units 4a to 4c are electric devices mounted in an automobile such as a head light, a wiper, an air conditioner or the like. A radio receiver 6 is supplied with electric power from the battery 2 through a switch 5 and receives high-frequency radio wave from an antenna 7. The voltage detection terminal S is connected to the anode side of the battery 2. The cathode side of the battery 2 is grounded.

In the aforesaid arrangement, when an internal combustion engine is rotating, the voltage regulator 13 detects the voltage of the battery 2 and performs the feedback control.

To be more concrete, when the voltage of the battery 2 is low, the voltage at the voltage dividing portion between the resistors 19a and 19b serving as the voltage divider becomes lower than the voltage of the reference voltage source 18. In this case, the output signal of the comparator 17, that is, a driving signal becomes high level, so that the delay circuit 16 increases the voltage supplied to the gate of the MOS power transistor 15 thereby to turn on the MOS power transistor 15.

When the MOS power transistor 15 is turned on, the field current flowing through the field winding 12 increases and so the voltage generated in the armature windings 10a to 10c also increases. As a consequence, the voltage applied to the battery 2 from the rectifier 12 through the terminal B increases.

In contrast, when the voltage of the battery 2 is high, the voltage at the voltage dividing portion between the resistors 19a and 19b becomes higher than the voltage of the reference voltage source 18. In this case, the output signal of the comparator 17 becomes low level, so that the delay circuit 16 decreases the voltage applied to the gate of the MOS power transistor 15 thereby to turn off the MOS power transistor 15. When the MOS power transistor 15 is turned off, the field current flowing through the field winding 12 is attenuated through the diode 14 and so the voltage generated in the armature windings 10a to 10c decreases. As a consequence, the voltage of the battery 2 decreases.

The aforesaid operations are repeatedly performed thereby to adjust the output voltage of the battery 2 to the constant value.

Figure 2:
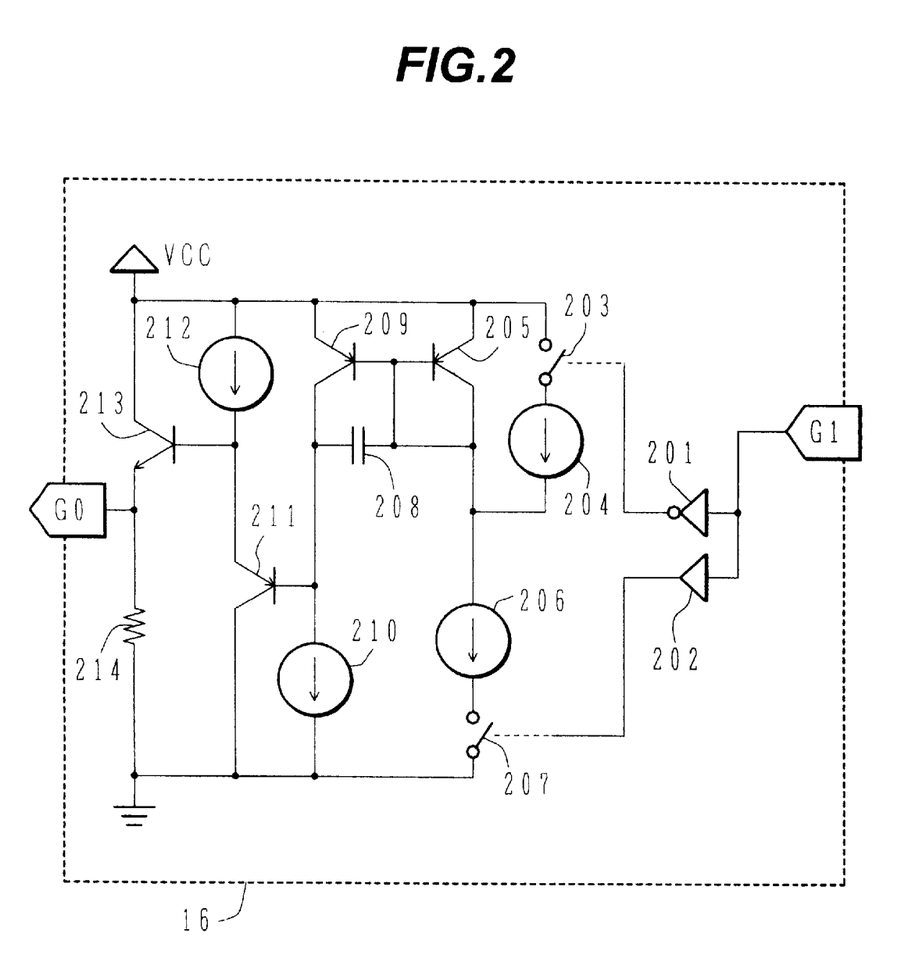
FIG. 2 is a circuit diagram of a delay circuit in FIG. 1.

FIG. 2 is a circuit diagram of the delay circuit 16. The delay circuit 16 outputs a delayed signal G0 in response to a high/low command input G1. The signal G0 is a ramp shaped (slanted shaped) wave signal. Accordingly, the delay circuit 16 may be defined as a function generation circuit.

In FIG. 2, a reference numeral 201 depicts a NOT gate and 202 depicts a buffer gate. The command input G1 is supplied to the NOT gate 201 and the buffer gate 202. A reference numeral 203 depicts a switch which is closed when the output of the NOT gate 201 is at a high level, and 207 depicts a switch which is closed when the output of the buffer gate 202 is at a high level.

Reference numerals 204, 206, 210 212 each depicts a constant current source, 205, 209, 211 each depicts a PNP transistor, 213 depicts an NPN transistor, 208 depicts a capacitor and 214 depicts a resistor.

One terminal of the switch 203 is grounded through the constant current sources 204, 206 and the switch 207. The other terminal of the switch 203 is connected to the emitter of the transistor 205, the emitter of the transistor 209, the constant current source 212 and the collector of the transistor 213. The collector of the transistor 205 is connected to the constant current sources 204, 206, the bases of the transistors 205, 209 and one end of the capacitor 208.

The other end of the capacitor 208 is connected to the collector of the transistor 209 and the base of the transistor 211 and further grounded through the constant current source 210. The emitter of the transistor 211 is connected to the constant current source 212 and the base of the transistor 213. The collector of the transistor 211 is grounded. The emitter of the transistor 213 is connected to the output terminal of the output signal G0 and grounded through the resistor 214.

In other words, the delay circuit (function generation circuit) 16 shown in FIG. 2 includes the capacitor 208, a charge/discharge circuit (that is, the NOT gate 201, the buffer gate 202, the switches 203, 207, the constant current sources 204, 206, 210 and the transistors 205, 209) for charging the capacitor 16 with electric charges and discharging electric charges therefrom in synchronous with the signal G1 for turning on or off the MOS transistor 15, and an amplifier (that is, the constant current source 212, the transistors 211, 213 and the resistor 214) for outputting a voltage corresponding to the voltage of the capacitor 208.

In the delay circuit 16 shown in FIG. 2, when the command input G1 is at a low level, the output of the NOT gate 201 becomes high level and the output of the buffer gate 202 becomes low level thereby to turn on the switch 203 and turn off the switch 207. In this case, current does not flow through any of the PNP transistors 205 and 209 since they are reversely biased, so that current flows through the constant current source 204, the capacitor 208 and the constant current source 210 thereby to charge the capacitor 208. When the capacitor 208 is charged, the voltage of the low voltage level side terminal of the capacitor 208, that is, the collector voltage of the transistor 209 decreases to the ground level.

In contrast, when the command input G1 is at a high level, the output of the NOT gate 201 becomes low level and the output of the buffer gate 202 becomes high level thereby to turn off the switch 203 and turn on the switch 207. In this case, current equal to that flowing through the constant current source 206 flows through the PNP transistor 205.

Accordingly, the capacitor 208 starts discharging electric charges charged therein gradually. The voltage of the high voltage level side terminal of the capacitor 208 (that is, the connection point side to the base of the transistor 209) is constant of about 4.3 volt which is lower than the circuit power source voltage VCC (5.0 volt) by the emitter-base voltage of the transistor 209 (constant value of about 0.7 volt), while the voltage of the low voltage level side terminal of the capacitor 208 (that is, the collector voltage of the transistor 209) increases with the lapse of time.

In this case, the current flowing into the capacitor 208 is equal to the base current of the transistor 209 as represented by the following expression (1).

$$I_{(c208)} = I_{210} / h_{FE} \tag{1}$$

Where $I_{(208)}$ represents the current flowing into the capacitor 208, $I_{(210)}$ represents the current of the constant current source 210 and $h_{FE}$ represents the current amplification factor of the transistor 209.

Usually, the voltage of a capacitor can be represented by an integration value of the current flowing into the capacitor, so that the voltage of the low voltage level side terminal of the capacitor 208, that is, the collector voltage of the transistor 209 increases with a constant ratio.

Figure 3A:
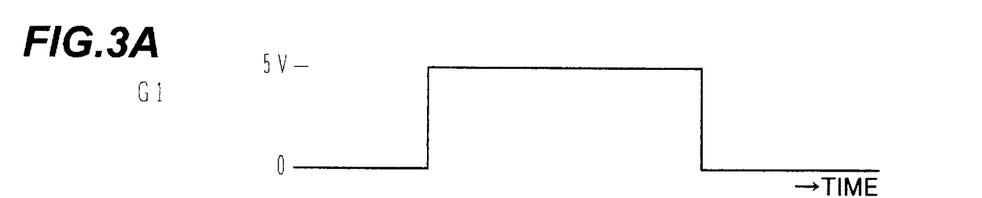
FIGS. 3A, 3B and 3C are diagrams showing waveforms of signals in the delay circuit in FIG. 2.
Figure 3B:
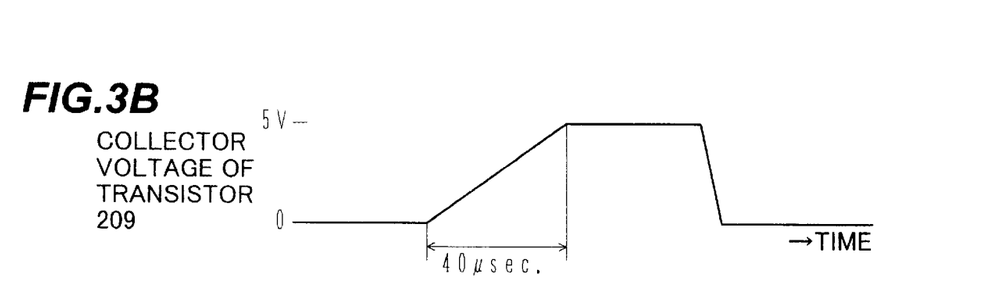
Figure 3C:
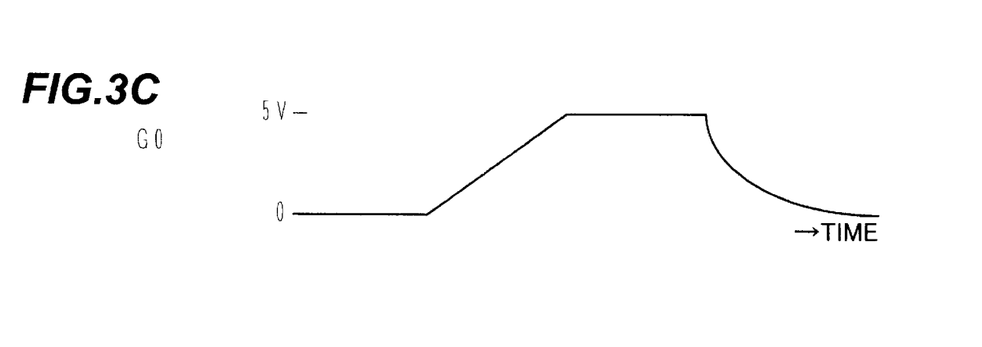

FIGS. 3A, 3B and 3C show voltage waveforms of various signals in the delay circuit in FIG. 2. FIG. 3A shows the voltage waveform of the input signal G1 and FIG. 3B shows the collector voltage waveform of the transistor 209 responding to the input signal Gl. In this example, the rising time of the collector voltage of the transistor 209 is set to 40 μsecond. As shown in FIG. 2, the transistors 211 and 213 form an emitter follower circuit which outputs the voltage equal to the collector voltage of the transistor 209 to the output terminal for the output signal G0. Accordingly, the output signal G0 rises like the collector voltage of the transistor 209 as shown in FIG. 3C.

Figure 4:
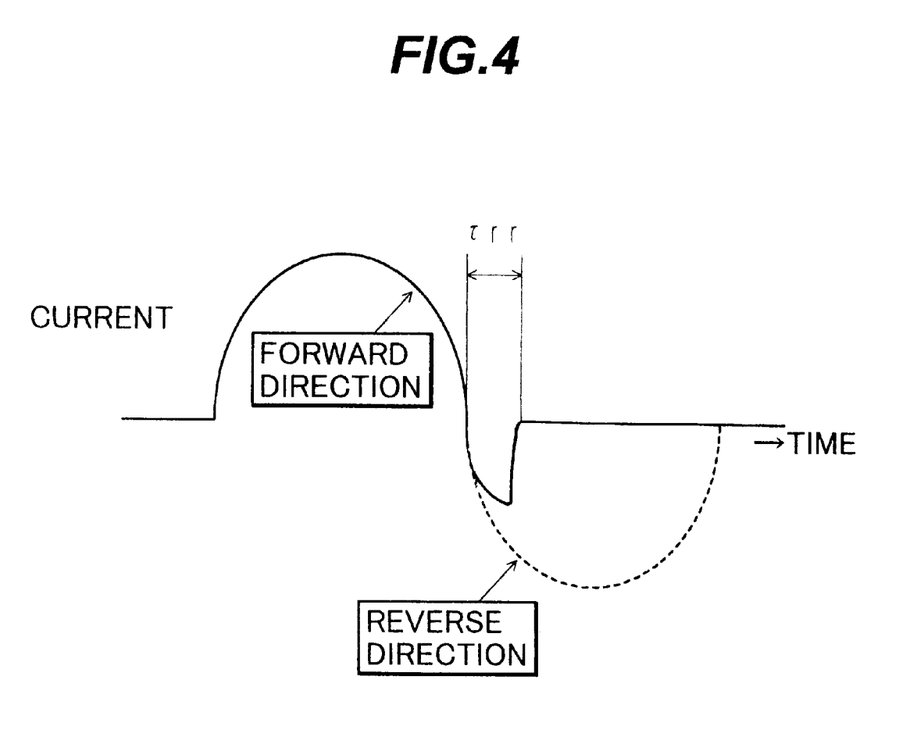
FIG. 4 is a diagram showing a current waveform of a diode in FIG. 1.

FIG. 4 shows a current waveform of the diode 14 at the time of applying a sine-wave voltage thereto. In general, a diode has such characteristics that it flows a current therethrough for a short time when a reverse voltage is applied thereto. Such a time period is called a reverse recovery time ($\tau_{rr}$). The reverse recovery time ($\tau_{rr}$) is generally in a range of about 1 μsecond to 10 μsecond. The forward current flows through the diode 14 while the MOS power transistor 15 is turned off, whereas the MOS power transistor 15 is not placed in a completely turned-on state until the lapse of at least the reverse recovery time $\tau_{rr}$ after the MOS power transistor 15 is turned on thereby to reversely bias the diode 14.

If the MOS power transistor 15 is turned on during the reverse recovery time $\tau_{rr}$, a short-circuit current flows through the battery 2, the diode 14 and the MOS power transistor 15. Since the internal impedance of the battery 2 is low, the short-circuit current becomes in a range of about 50 A to 100 A. An excessive amount of current flows to the wiring cable of the battery 2 although for a moment, so that electromagnetic wave is generated from the wiring cable and then entered into the radio receiver 6 through the antenna 7 as noise.

That is, although a diode (the diode 14 in this example) is connected in parallel to the filed winding 12 so as to prevent the generation of the fly-back voltage in the field winding 12, the radio noise is generated due to the reverse recovery characteristics of the diode 14.

The inventors of the present invention have elucidated that the radio noise can be reduced effectively if a time period required for the MOS power transistor 15 to shift from the completely turned-off state to the completely turned-on state is set to be longer than the reverse recovery time $\tau_{rr}$ of the diode 14.

In other words, if the MOS power transistor 15 is arranged to be shifted from the completely turned-off state to the completely turned-on state, that is, the drain current of the MOS power transistor 15 is increased in a ramp shaped (slanted shaped) manner from 0 ampere to a constant current value (e.g., 2 ampere) with the time period longer than the reverse recovery time $\tau_{rr}$ of the diode 14, there flows little reverse current through the diode 14.

In this case, it is prevented that the short-circuit current flows through the battery 2, the diode 14 and the MOS power transistor 15, and hence it is prevented that noise enters into the radio receiver 6.

It has been proved by the experiments etc. that, in order to increase the drain current of the MOS power transistor 15 in the ramp shaped manner from 0 ampere to the constant current value (e.g., 2 ampere) with the time period longer than the reverse recovery time $\tau_{rr}$ of the diode 14, it is necessary to make the time period required for shifting the MOS power transistor 15 from the completely turned-off state to the completely turned-on state to be quite longer than the reverse recovery time $\tau_{rr}$.

For example, if the reverse recovery time $\tau_{rr}$ of the diode 14 is in a range of 1 μsecond to 10 μsecond as described above, the generation of the noise can be prevented so long as the gate voltage of the MOS power transistor 15 (that is, the collector voltage of the transistor 209) is increased in the ramp shaped manner from 0 volt to 5 volt with a time period of 40 μsecond, for example.

In this respect, a diode with a reverse recovery time of 0.2 μsecond may also be used as the diode 14. Explanation will be made as to experimented examples of the turn-on time period of the gate voltage of the MOS power transistor 15 necessary for effectively reducing the noise level in the prior art where the MOS power transistor 15 is not arranged to increase its gate voltage in a ramp shaped manner, in the respective cases where the reverse recovery time $\tau_{rr}$ of the diode 14 is 0.2 μsecond and 2.0 μsecond. In these cases, the turn-on time period is one for increasing the gate voltage of the MOS power transistor 15 from 0 volt to 15 volt in order to suppress the noise level to −20 dBμ of the prior art when the frequency is 600 kHz.

The noise level was suppressed to −20 dBμ of the prior art when the turn-on time period of the gate voltage of the MOS power transistor 15 was 70 μsecond in the case where the reverse recovery time $\tau_{rr}$ of the diode 14 was 0.2 μsecond. The noise level was also suppressed to −20 dBμ of the prior art when the turn-on time period of the gate voltage of the MOS power transistor 15 was 400 μ second in the case where the reverse recovery time $\tau_{rr}$ of the diode 14 was 2.0 μsecond.

The time period required for the MOS power transistor 15 to shift from the completely turned-off state to the completely turned-on state was 15 μsecond when the reverse recovery time $\tau_{rr}$ of the diode 14 was 0.2 μsecond and the turn-on time period of the gate voltage of the MOS power transistor 15 was 70 μsecond. Further, the time period required for the MOS power transistor 15 to shift from the completely turned-off state to the completely turned-on state was 50 μsecond when the reverse recovery time $\tau_{rr}$ of the diode 14 was 2.0 μsecond and the turn-on time period of the gate voltage of the MOS power transistor 15 was 400 μsecond.

Figure 5:
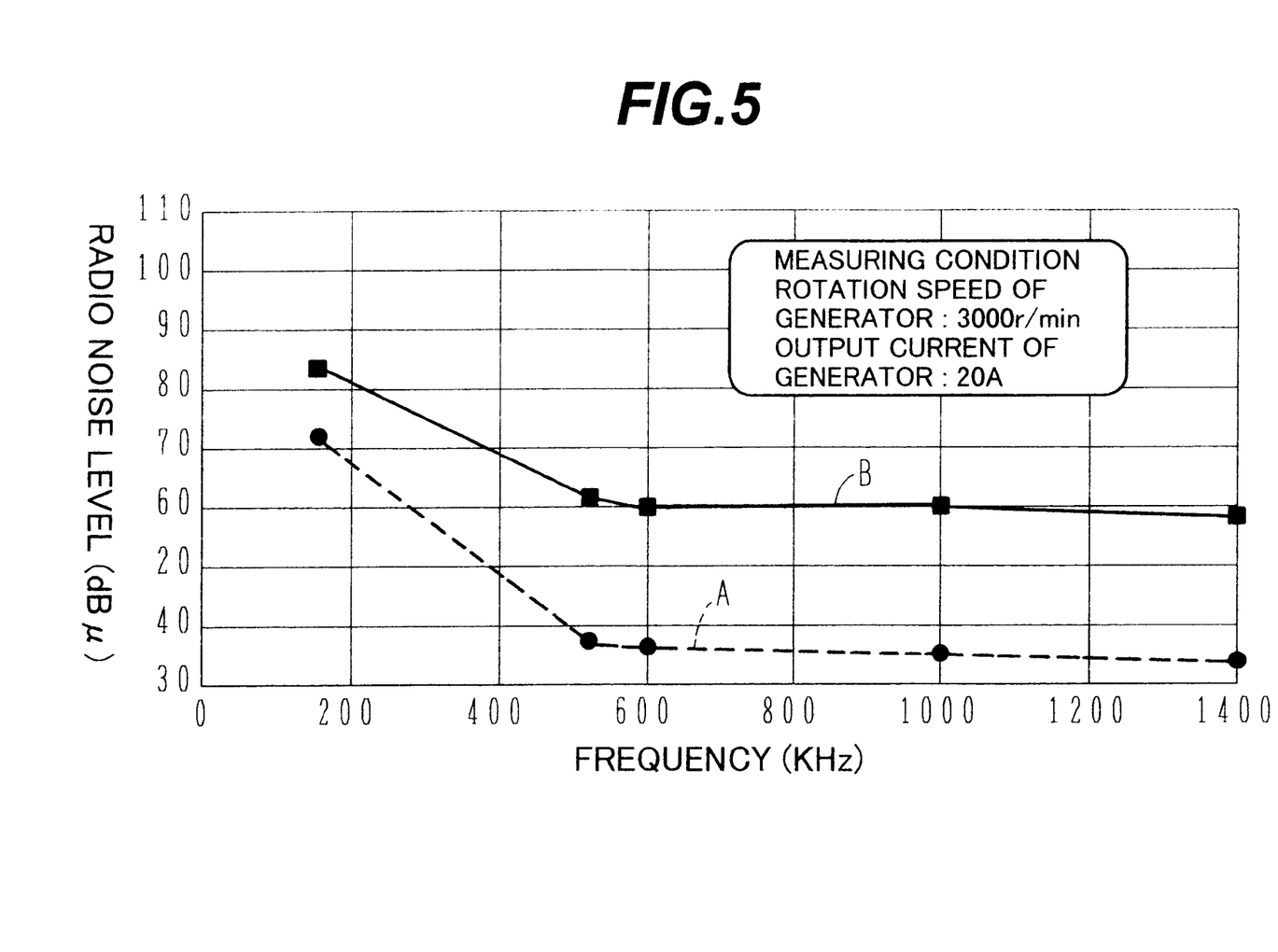
FIG. 5 is a graph showing levels of radio noise generated in the voltage regulator for a generator of an automobile according to the embodiment of the present invention and that of the prior art.

FIG. 5 is a graph for comparing levels of radio noise generated in the voltage regulator for a generator of an automobile according to the embodiment of the present invention and that of the prior art. This graph shows an example where the rotation speed of the generator is 300 r/minute and the output current from the generator is 20 ampere.

As clear from FIG. 5, the radio noise level of the embodiment of the present invention (a dotted line A) is reduced by −20 dBμ or more as compared with the radio noise level of the prior art (a steady line B) in the frequency range of 500 kHz or more.

As described above, according to the embodiment of the present invention, the delay circuit 16 serves to increase the drain current of the MOS power transistor 15 in the ramp shaped manner from 0 ampere to the constant current value thereby to shift the MOS power transistor 15 from the completely turned-off state to the completely turned-on state with a time period longer than the reverse recovery time $\tau_{rr}$ of the diode 14. Accordingly, there flows little reverse current through the diode 14 and so such a phenomenon is prevented from occurring that the short-circuit current flows through the battery 2, the diode 14 and the MOS power transistor 15, and hence the generation of the switching noise, that is, the noise from the radio receiver 6 can be prevented.

In this case, since the delay circuit 16 can be formed by a simple circuit including transistors, a capacitor etc., it is possible to realize the driving apparatus for the MOS transistor which is capable of suppressing the generation of radio noise etc. with simple arrangement and cheep cost.

Although the explanation has been made as to the case where the present invention is applied to a voltage regulator for a generator of an automobile, the present invention may be applied to other apparatus such as a driving apparatus for a MOS transistor which controls a current flowing into a field winding which is used for controlling the rotation of a motor and connected in parallel to a diode.

The present invention has the following technical advantage due to the aforesaid configuration. The delay circuit (that is, a function generation circuit) serves to shift the MOS power transistor from the completely turned-off state to the completely turned-on state with a time period longer than the reverse recovery time $\tau_{rr}$ of the diode. Accordingly, there flows little reverse current through the diode and so such a phenomenon is prevented from occurring that the short-circuit current flows through the battery, the diode and the MOS power transistor. In this case, the delay circuit can be formed by a simple circuit including transistors, a capacitor etc.

Accordingly, it is possible to realize the driving apparatus for the MOS transistor which is capable of suppressing the generation of radio noise etc. with simple arrangement and cheep cost.

What is claimed is:

1. A driving apparatus for a MOS transistor comprising:
    a diode connected in parallel to a winding which is connected in series with a battery;
    a MOS transistor connected between said winding and said battery;
    a driving circuit which generates signals for turning on and off said MOS transistor to drive a gate of said MOS transistor; and
    a delay circuit which is disposed between said driving circuit and said MOS transistor and delays said signal generated from said driving circuit for changing said MOS transistor from a turned-off state to a turned-on state by increasing drain current of the MOS transistor in a ramp-shaped manner so that said MOS transistor is shifted from a completely turned-off state to a completely turned-on wit h a predetermined time period longer than a reverse recovery time of said diode.

2. A driving apparatus for a MOS transistor comprising:
    a diode connected in parallel to a winding which is connected in series with a battery;
    a MOS transistor connected between said winding and said battery;
    a driving circuit which generates signals for turning on and off said MOS transistor to drive a gate of said MOS transistor; and
    a function generation circuit which is disposed between said driving circuit and said MOS transistor and converts said signal generated from said driving circuit for changing said MOS transistor from a turned-off state to a turned-on state into a voltage which is to be applied to said gate of said MOS transistor as a voltage of time function gradually increasing with time lapse in which drain current of the MOS transistor increases in a ramp-shaped manner so that said MOS transistor is shifted from a completely turned-off state to a completely turned-on state with a predetermined time period longer than a reverse recovery time of said diode.

3. A driving apparatus for a MOS transistor according to claim 2, wherein said function generation circuit includes a capacitor, a single charging and discharging circuit for charging and discharging said capacitor synchronously with said signals for turning on and off said MOS transistor, and an amplifier for outputting a voltage corresponding to a voltage of said capacitor.

4. A driving apparatus for a MOS transistor comprising:

an armature winding of a generator for charging a battery;

a diode connected in series with said battery and connected in parallel to a filed winding for supplying magnetic flux to said armature winding;

a MOS transistor connected between said field winding and said battery;

a driving circuit which generates signals for turning on and off said MOS transistor to drive a gate of said MOS transistor; and a function generation circuit which is disposed between said driving circuit and said MOS transistor and converts said signal generated from said driving circuit for changing said MOS transistor from a turned-off state to a turned-on state into a voltage which is to be applied to said gate of said MOS transistor as a voltage of time function gradually increasing with time lapse in which drain current of the MOS transistor increases in a ramp-shaped manner so that said MOS transistor is shifted from a completely turned-off state to a completely turned-on state with a predetermined timed period longer than a reverse recovery time of said diode.

5. A driving apparatus for a MOS transistor according to claim 4, wherein said function generation circuit includes a capacitor, a single charging and discharging circuit for charging and discharging said capacitor synchronously with said signals for turning on and off said MOS transistor, and an amplifier for outputting a voltage corresponding to a voltage of said capacitor.

6. A driving apparatus for a MOS transistor comprising:

an armature winding of a generator for charging a battery;

a diode connected in series with said battery and connected in parallel to a filed winding for supplying magnetic flux to said armature winding;

a MOS transistor connected between said field winding and said battery;

a driving circuit which generates signals for turning on and off said MOS transistor to drive a gate of said MOS transistor; and a delay circuit which is disposed between said driving circuit and said MOS transistor and delays said signal generated from said driving circuit for changing of MOS transistor from a turned-off state to a turned-on state by increasing drain current of the MOS transistor so that said MOS transistor is shifted from a completely turned-off state to a completely turned-on state with a predetermined time period longer than a reverse recovery time of said diode.

7. A driving apparatus for a MOS transistor comprising:

a diode connected in parallel to a winding connected in series to a battery;

a MOS transistor connected to said winding;

a driving circuit for generating signals for turning on and off said MOS transistor to drive a gate of said MOS transistor; and a delay circuit connected between said driving circuit and said MOS transistor, said delay circuit delaying said signal generated from said driving circuit for changing said MOS transistor from a turned off state to a turned on state by increasing drain current of the MOS transistor in a ramp-like manner so that said MOS transistor is shifted from a completely turned off state to a completely turned on state with a predetermined time period longer than a reverse recovery time of said diode.

8. A driving apparatus for a MOS transistor according to claim 7, wherein said driving apparatus is connected to a generator for an automobile.

* * * * *